United States Patent
Morita et al.

(10) Patent No.: US 7,772,690 B2
(45) Date of Patent: Aug. 10, 2010

(54) INSULATING FILM

(75) Inventors: Kensuke Morita, Haibara-gun (JP); Koji Wariishi, Haibara-gun (JP); Akira Asano, Haibara-gun (JP); Makoto Muramatsu, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 148 days.

(21) Appl. No.: 12/040,988

(22) Filed: Mar. 3, 2008

(65) Prior Publication Data

US 2008/0217746 A1 Sep. 11, 2008

(30) Foreign Application Priority Data

Mar. 2, 2007 (JP) .............................. 2007-053402

(51) Int. Cl.
*H01L 23/053* (2006.01)
*H01L 23/141* (2006.01)

(52) U.S. Cl. .................. 257/702; 257/701; 174/258

(58) Field of Classification Search ................. 257/701, 257/702
See application file for complete search history.

(56) References Cited

U.S. PATENT DOCUMENTS

| 7,357,977 B2 * | 4/2008 | Dimitrakopoulos et al. ................ 428/312.6 |
| 2004/0202956 A1 * | 10/2004 | Takahashi et al. ......... 430/270.1 |

OTHER PUBLICATIONS

F.L.Galeener, Journal of Non-Crystalline Solids 49 (1982) 53-62 Planar Rings in Vitreous Silica.

\* cited by examiner

*Primary Examiner*—N Drew Richards
*Assistant Examiner*—Sergey Alekseyev
(74) *Attorney, Agent, or Firm*—Sughrue Mion, PLLC

(57) ABSTRACT

An insulating film for semiconductor devices is obtained by curing, on a substrate, a high molecular compound obtained by polymerizing a cage-type silsesquioxane compound having two or more unsaturated groups as substituents and having a cyclic siloxane structure, wherein the structure of the cage-type silsesquioxane compound is not broken by curing, and the breakage of the cage structure can be detected by observing a peak at approximately 610 cm$^{-1}$ in Raman spectrum of the film after curing.

4 Claims, 2 Drawing Sheets

RAMAN SPECTRUM OF EXAMPLE A
BEFORE AND AFTER CURING

RAMAN SPECTRUM OF EXAMPLE A
BEFORE AND AFTER CURING

FIG. 1

RAMAN SPECTRUM OF EXAMPLE E
BEFORE AND AFTER CURING

FIG. 2

INSULATING FILM

BACKGROUND OF THE INVENTION

1. Field of the Invention

The present invention relates to an insulating film, more specifically, to an insulating film having an adequately uniform thickness and moreover, excellent in dielectric properties as an interlayer insulating film material in semiconductor devices and the like.

2. Description of the Related Art

A silica ($SiO_2$) film formed by a vacuum process such as chemical vapor deposition (CVD) has hitherto been used frequently as an interlayer insulating film for semiconductor devices and the like. With a purpose of forming a more uniform interlayer insulating film, an insulating film of an application type composed mainly of a hydrolysate of a tetraalkoxysilane, which is called SOG (Spin on Glass) film, has recently been used. With an increase in the integration density of a semiconductor device or the like, a low-dielectric-constant interlayer insulating film composed mainly of a polyorganosiloxane which is called organic SOG is under development. In particular, a siloxane compound having a cyclic structure can have a reduced dielectric constant because owing to its bulky cyclic structure, it has free spaces around the molecular chain thereof.

It is however confirmed by the Raman analysis that the cyclic structure of the cyclic polysiloxane compound is broken during a curing step. As a result of the breakage of the cyclic structure, a film obtained using such a compound inevitably has a high dielectric constant.

SUMMARY OF THE INVENTION

An object of the present invention is therefore to provide a insulating film capable of overcoming the above-described problem, more specifically, an insulating film having an adequately uniform thickness and moreover, having a low density and a low refractive index and excellent in film properties such as dielectric constant and Young's modulus so that it is suited for use as an interlayer insulating film in semiconductor devices and the like (the term "insulating film" is also referred to as "dielectric film" and "dielectric insulating film", but these terms are not substantially distinguished). The above-described problem can be solved by converting the cyclic siloxane structure into a three-dimensional cage-type siloxane structure, thereby reinforcing a siloxane bond network.

It has been found that the above-described object of the invention can be accomplished by the following means.

(1) An insulating film for semiconductor devices obtained by curing, on a substrate, a high molecular compound obtained by polymerizing a cage-type silsesquioxane compound having two or more unsaturated groups as substituents and having a cyclic siloxane structure, wherein the structure of the cage-type silsesquioxane compound is not broken by curing.

(2) An insulating film for semiconductor devices obtained by curing, on a substrate, a high molecular compound obtained by polymerizing a cage-type silsesquioxane compound having two or more unsaturated groups as substituents and having a cyclic siloxane structure, wherein a peak at approximately 610 $cm^{-1}$ is not observed in a Raman spectrum of the film after curing.

(3) The insulating film as described in (1) or (2) above, wherein the cage-type silsesquioxane compound has m number of $RSi(O_{0.5})_3$ units, in which m stands for an integer of from 8 to 16, and Rs each independently represents a non-hydrolyzable group, with the proviso that at least two of Rs are each a vinyl- or ethynyl-containing group, and wherein each of the units is linked to another unit via an oxygen atom possessed in common and constitutes the cage structure.

(4) The insulating film as described in (3) above, wherein m stands for an integer of 8, 10 or 12.

(5) The insulating film as described in (3) or (4) above, wherein at least two of Rs are vinyl groups.

(6) The insulating film as described in (5) above, wherein Rs are all vinyl groups.

In (1) above, no particular limitation is imposed on a method of preventing the cage structure from being broken by the curing reaction. Examples of it include a method of obtaining the silsesquioxane compound as that having a cage-type silsesquioxane structure with a cyclic structure and carrying out polymerization of the resulting compound so as to link two adjacent cage structures via a bond represented by Si—(—C—)$_n$—Si wherein n stands for a number preferably 3 or less.

The present inventors investigated the relation between the dielectric constant of various siloxane compounds and mechanical strength of films obtained using them. As a result, it has been found that in the Raman spectroscopy, after curing, of a film obtained using a compound in which two adjacent cage structures had been linked via an Si—(—C—)$_n$—Si bond wherein n stands for a number of 4 or greater, a large peak which was presumed to derive from a three-membered ring siloxane bond was observed at a Raman shift of 610 $cm^{-1}$ and the film had a deteriorated dielectric constant, while in the Raman spectroscopy, after curing, of a film obtained using a compound in which two adjacent cage structures had been linked via an Si—(—C—)$_n$—Si bond wherein n stands for a number 3 or less, a peak was not observed at a Raman shift of 610 $cm^{-1}$ and the film showed a good dielectric constant.

The peak at 585 $cm^{-1}$ in the Raman shift of a siloxane compound is attributable to a three-membered ring siloxane bond. An increase in the peak in this region after curing reaction means that a four-membered ring before curing is broken by a film curing reaction and a three-membered ring is formed. The attribution of a peak in the Raman shift is described, for example, in A. Lee Smith, et al., *App. Spec.* 38, 622 (1984).

DETAILED DESCRIPTION OF THE INVENTION

The insulating film of the invention is an insulating film for semiconductor devices obtained by curing, on a substrate, a high molecular compound obtained by polymerizing a cage-type silsesquioxane compound having two or more unsaturated groups as substituents and having a siloxane structure with a cyclic structure and it is characterized by that the cage structure is not broken by the curing reaction.

Examples of the cage-type silsesquioxane compound having two or more unsaturated groups as substituents (which may hereinafter be called "compound (I)") include compounds (which may hereinafter be called "Compound (I')") having m numbers of $RSi(O_{0.5})_3$ units (in which m stands for an integer of from 8 to 16 and Rs each independently repre- sents a nonhydrolyzable group, with the proviso that at least two of Rs are each a vinyl- or ethynyl-containing group), wherein the units are linked to each other via a common oxygen atom and thereby constitute a cage structure.

From the viewpoint of reducing the dielectric constant, m in the compound (I') stands for preferably 8, 10, 12, 14 or 16, while it is preferably 8, 10 or 12 from the viewpoint of availability.

The term "cage structure" as used herein means a molecule whose cavity is defined by a plurality of rings formed of covalently bonded atoms and in which all points present inside the cavity cannot leave the cavity without passing through the rings.

Examples of the cage structure represented by the formula (I) are shown in the following. A free bond in the following formulas indicates a bonding site of R.

(Q-4)

(Q-1)

(Q-5)

(Q-2)

(Q-6)

(Q-3)

(Q-7)

In the compound (I), Rs each independently represents a nonhydrolyzable group.

The term "nonhydrolyzable group" as used herein means a group at least 95% of which remains without being hydrolyzed when brought into contact with 1 equivalent amount of neutral water at room temperature for one hour. A nonhydrolyzable group at least 99% of which remains without being hydrolyzed under the above conditions is preferred.

At least two of Rs are vinyl- or ethynyl-containing groups. Examples of the nonhydrolyzable group as R include alkyl groups (such as methyl, t-butyl, cyclopentyl and cyclohexyl), aryl groups (such as phenyl, 1-naphthyl and 2-naphthyl), vinyl group, ethynyl group, allyl group, and silyloxy groups (such as trimethylsilyloxy, triethylsilyloxy and t-butyldimethylsilyloxy).

Among the groups represented by Rs, at least two of the groups represented by Rs are vinyl- or ethynyl-containing groups, preferably at least two of the groups represented by Rs are vinyl-containing groups. When the groups represented by Rs contain a vinyl or ethynyl group, the vinyl or ethynyl group is preferably bonded, directly or via a divalent linking group, to a silicon atom to which R is to be bonded. Example of the divalent linking group include —[C(R$^{11}$)(R$^{12}$)]$_k$—, —CO—, —O—, —N(R$^{13}$)—, —S— and —O—Si(R$^{14}$)(R$^{15}$)—, and divalent linking groups available using them in any combination. In these formulas, R$^{11}$ to R$^{15}$ each independently represents a hydrogen atom, methyl group, ethyl group or phenyl group and k stands for an integer from 1 to 6. Of these groups, —[C(R$^{11}$)(R$^{12}$)]$_k$—, —O—, —O—Si(R$^{14}$)(R$^{15}$)—, and divalent linking groups available using them in any combination are preferred.

In Compound (I), the vinyl or ethynyl group is preferably bonded directly to a silicon atom to which R is to be bonded.

With regard to Rs in Compound (I), it is more preferred that at least two vinyl groups are directly bonded to a silicon atom to which R is to be bonded; still more preferred that at least a half of Rs in Compound (I) are vinyl groups; and especially preferred that Rs are all vinyl groups.

Specific examples of Compound (I) include, but not limited to, the following compounds.

(I-a)

R =

-continued

(I-b)

R =

(I-c)

R =

(I-d)

R =

-continued

R =

As Compound (1), either a commercially available compound or a compound synthesized in a known manner may be used.

It is also preferred that Rs of Compound (I) of the invention are each represented by the following formula (II). In this case, it can be synthesized by reacting a compound represented by the following formula (III) (which will hereinafter be called "Compound (III)") with a compound represented by the following formula (IV) (which will hereinafter be called "Compound (IV)").

$(R^1)_3-Si-O-$ (II)

$[MO-Si(O_{0.5})_3]_m$ (III)

$(R^1)_3-Si-Cl$ (IV)

The compound (III) can be synthesized, for example, by the process described in *Angew. Chem. Int. Ed. Engl.* 36(7), 743-745 (1997).

In the above formulas, $R^1$s each independently represents a nonhydrolyzable group. Specific examples of the nonhydrolyzable group as $R^1$ include alkyl groups, aryl groups, vinyl group and ethynyl group, and m has the same meaning as in Compound (I'). M represents a metal atom (for example, Na, K, Cu, Ni or Mn) or an onium cation (for example, tetramethylammonium). When M represents a polyvalent metal atom, a plurality of $-O-Si(O_{0.5})_3$s are bonded to the polyvalent metal atom M.

The reaction between the compound (III) with the compound (IV) is performed, for example, typically at from 0 to 180° C. for from 10 minute to 20 hours under stirring while adding the compound (III) and from 1 to 100 moles, per mole of the Si—OM groups contained in the compound (III), of the compound (IV) to a solvent.

As the solvent, organic solvents such as toluene, hexane, and tetrahydrofuran (THF) are preferred.

When the compound (III) is reacted with the compound (IV), a base such as triethylamine or pyridine may be added.

The composition for forming the insulating film of the invention (which may hereinafter be called "composition of the invention") may contain a polymerized product of a plurality of compounds (I) different from each other. The polymerized product may be either a copolymer composed of a plurality of Compounds (I) different from each other or a mixture of homopolymers. When the composition of the invention contains a copolymer composed of a plurality of Compounds (I) different from each other, the copolymer is preferably that of a mixture of two or more Compounds (I') selected from Compounds (I') wherein m stands for 8, 10 and 12, respectively.

The composition of the invention may be a copolymerized product with a compound other than Compound (I). Such a compound has preferably a plurality of polymerizable carbon-carbon unsaturated bonds or SiH groups. Preferred examples of the compound include vinylsilanes, vinylsiloxanes, phenylacetylenes and $[(HSiO_{0.5})_3]_8$.

The composition of the invention may be either a solution of Compound (I) or reaction product thereof dissolved in an organic solvent or a solid matter containing Compound (I) or reaction product thereof.

The total amount of the polymerized product obtained by the reaction between Compounds (I) accounts for preferably 70 mass % or greater, more preferably 80 mass % or greater, still more preferably 90 mass % or greater, most preferably 95 mass % or greater of the solids contained in the composition of the invention. (In this specification, mass ratio is equal to weight ratio.) As the content of the polymerized product obtained by the reaction between Compounds (I) in the solids is greater, a film with a lower density, lower refractive index and lower dielectric constant can be formed.

The term "solids" as used herein means components which have remained after volatile components are subtracted from all the components contained in the composition. The volatile components include components that volatilize after decomposition into a low molecular compound. Examples of the volatile components include water, organic solvents, pore-forming thermally decomposable polymers and thermally desorbable substituents.

Examples of the components contained in the solid component of the invention excluding the polymerized substance obtained by the reaction between Compounds (I) include Compound (I), components other than the reaction product of Compound (I) contained in the copolymerized substance containing the reaction product of Compound (I), and nonvolatile additives.

The amount of Compound (I) can be determined using a GPC chart, HPLC chart, NMR spectrum, UV spectrum or IR spectrum of the solid component. Amounts of the components in the copolymerized substance can be sometimes determined from their charged ratios, but can also be determined by subjecting the solid component, which has been purified if necessary, to NMR spectrum, UV spectrum, IR spectrum or elemental analysis.

The amount of the nonvolatile additive can be determined by using the amount of it added to the composition as an amount present in the solid component or from a GPC chart or HPLC chart of the solid component. It can also be determined by subjecting the solid component, which has been purified if necessary, to NMR spectrum, UV spectrum, IR spectrum or elemental analysis.

The solid component excluding them is the polymerized substance obtained by the reaction between Compounds (I).

In order to obtain a film having good surface conditions after application and not undergoing a film thickness loss during curing, the amount of the compound (I) which has remained unreacted in the solid component of the composition of the invention is preferably smaller.

The amount of the compound (I) in the solid component is 15 mass % or less, preferably 10 mass % or less, most preferably 5 mass % or less.

A portion, in the GPC chart, of the solid component contained in the composition of the invention excluding Compound (I) has a number-average molecular weight (Mn) of from 20,000 to 200,000, more preferably from 25,000 to 150,000, most preferably from 30,000 to 100,000.

A film having a lower density, a lower refractive index and a lower dielectric constant can be formed when the number-average molecular weight is greater.

In the invention, GPC was performed using "Waters 2695" and a GPC column "KF-805L" (trade name; product of Shodex) and, as an eluting solvent, tetrahydrofuran at a flow rate of 1 ml/min while setting a column temperature at 40° C.; injecting 50 µl of a tetrahydrofuran solution having a sample concentration of 0.5 mass %; and drawing a calibration curve for the monomer by utilizing an integrated value of an RI detector ("Waters 2414") to determine the amount of the monomer in the solid component. The Mn, Mw and $M_{Z+1}$ were values calculated based on a calibration curve drawn using standard polystyrene.

The (Z+1) average molecular weight ($M_{Z+1}$) of the portion, in the GPC chart, of the solids contained in the composition of the invention excluding the Compound (I) monomer is preferably from 90,000 to 600,000, more preferably from 120,000 to 450,000, most preferably from 150,000 to 300,000.

When the (Z+1) average molecular weight is greater than the above-described range, the resulting composition inevitably has deteriorated solubility in an organic solvent and deteriorated filtration properties through a filter, which may lead to worsening of surface properties of a film.

A composition having good solubility in an organic solvent and good filtration properties through a filter, and capable of providing a film having good surface conditions, a low density, a low refractive index and a low dielectric constant is available when the average molecular weight fall within the above-described range.

The portion, in the GPC chart, of the solids contained in the composition of the invention excluding the Compound (I) monomer has MW of preferably from 30,000 to 210,000, more preferably from 40,000 to 180,000, most preferably from 50,000 to 160,000.

From the viewpoints of solubility in an organic solvent, filterability through a filter and surface conditions of a film, the polymer of the invention is preferably substantially free of components having a molecular weight of 3,000,000 or greater, more preferably substantially free of components having a molecular weight of 2,000,000 or greater, most preferably free of components having a molecular weight of 1,000,000 or greater.

In the solid component of the composition of the invention, preferably from 10 to 90 mole %, more preferably from 20 to 80 mole %, most preferably from 30 to 70 mole % of the vinyl or ethynyl groups of Compound (I) remain unreacted.

To the reaction product of Compound (I) in the composition of the invention, from 0.1 to 40 mass %, more preferably from 0.1 to 20 mass %, still more preferably from 0.1 to 10 mass %, most preferably from 0.1 to 5 mass % of the polymerization initiator, additive or polymerization solvent may be bonded.

The amount of them may be determined by the NMR spectrum of the composition.

For preparation of the composition of the invention, Compound (I) is prepared preferably by utilizing a polymerization reaction between carbon-carbon unsaturated bonds.

It is especially preferred to dissolve Compound (I) in a solvent and then adding a polymerization initiator to the resulting solution to cause a reaction of a vinyl or ethynyl group.

Any polymerization reaction can be employed and examples include radical polymerization, cationic polymerization, anionic polymerization, ring-opening polymerization, polycondensation, polyaddition, addition condensation and polymerization in the presence of a transition metal catalyst.

The amount of Compound (I) which has remained at the time of completion of the polymerization reaction is preferably 25 mass % or less, more preferably 20 mass % or less, most preferably 15 mass % or less based on the addition amount of it. When this condition is satisfied at the time of polymerization, a film forming composition capable of providing a film having good surface conditions and undergoing a small film thickness loss during curing can be prepared in high yield.

The polymer has a weight average molecular weight (Mw), at the time of completion of the polymerization reaction, of preferably from 30,000 to 160,000, more preferably from 40,000 to 140,000, most preferably from 50,000 to 120,000.

The polymer has a (Z+1) average molecular weight ($M_{Z+1}$), at the time of completion of the polymerization reaction, of preferably from 90,000 to 700,000, more preferably from 120,000 to 550,000, most preferably from 150,000 to 400,000.

The polymer at the time of completion of the polymerization reaction is preferably substantially free of components having a molecular weight of 3,000,000 or greater, more preferably substantially free of components having a molecular weight of 2,000,000 or greater, most preferably free of components having a molecular weight of 1,000,000 or greater.

When these molecular weight conditions are satisfied at the time of polymerization, a film forming composition soluble in an organic solvent, having good filterability through a filter and capable of providing a film with a low density, a low refractive index and a low dielectric constant can be prepared.

In order to satisfy the above-described molecular weight conditions, the concentration of Compound (I) during the polymerization reaction is preferably 12 mass % or less, more preferably 10 mass % or less, still more preferably 8 mass % or less, most preferably 6 mass % or less.

The productivity at the time of the reaction is better when the concentration of Compound (I) at the time of the polymerization is higher. In this sense, the concentration of Compound (I) is preferably 0.1 mass % or greater, more preferably 1 mass % or greater at the time of the polymerization.

In the preparation process of the composition of the invention, the polymerization of Compound (I) is preferably followed by treatment such as removal of high molecular components by filtration or centrifugation, or purification by column chromatography.

In particular, it is preferred, as a preparation process of the composition of the invention, to subject the solid formed by the polymerization reaction to re-precipitation treatment to remove therefrom low molecular components and remaining Compound (I), thereby increasing the Mn and reducing the remaining amount of Compound (I).

The term "re-precipitation treatment" as used herein means collection, by filtration, of the composition of the invention which has been precipitated by adding a poor solvent (a solvent which does not substantially dissolve the composition of the invention therein) to the reaction mixture from which the reaction solvent has been distilled off as needed, adding dropwise the reaction mixture, from which the reaction solvent has been distilled off as needed, to a poor solvent, or dissolving the solid component in a good solvent and then adding the poor solvent to the resulting solution.

Examples of the good solvent include ethyl acetate, butyl acetate, toluene, methyl ethyl ketone and tetrahydrofuran. As the poor solvent, alcohols (methanol, ethanol and isopropyl alcohol), hydrocarbons (hexane and heptane) and water are preferred. The good solvent is used in an amount of preferably from 1 time to 50 times the mass, preferably from 2 times to 20 times the mass of the composition of the invention, while the poor solvent is used in an amount of preferably from 1 time to 20 times the mass, more preferably from 2 times to 50 times the mass of the composition of the invention.

The polymerization reaction of Compound (I) is preferably carried out in the presence of a non-metallic polymerization initiator. For example, polymerization can be carried out in the presence of a polymerization initiator showing activity while generating free radicals such as carbon radicals or oxygen radicals by heating.

As the polymerization initiator, organic peroxides and organic azo compounds are especially preferred.

Preferred examples of the organic peroxides include ketone peroxides such as "PERHEXA H", peroxyketals such as "PERHEXA TMH", hydroperoxides such as "PERBUTYL H-69", dialkylperoxides such as "PERCUMYL D", "PERBUTYL C" and "PERBUTYL D", diacyl peroxides such as "NYPER BW", peroxy esters such as "PERBUTYL Z" and "PERBUTYL L", and peroxy dicarbonates such as "PEROYL TCP", (each, trade name; commercially available from NOF Corporation), diisobutyryl peroxide, cumylperoxyneodecanoate, di-n-propylperoxydicarbonate, diisopropylperoxydicarbonate, di-sec-butylperoxydicarbonate, 1,1,3,3-tetramethylbutylperoxyneodecanoate, di(4-t-butylchlorohexyl)peroxydicarbonate, di(2-ethylhexyl) peroxydicarbonate, t-hexylperoxyneodecanoate, t-butylperoxyneodecanoate, t-butylperoxyneoheptanoate, t-hexylperoxypivalate, t-butylperoxypivalate, di(3,5,5-trimethylhexanoyl)peroxide, dilauroyl peroxide, 1,1,3,3-tetramethylbutylperoxy-2-ethylhexanoate, disuccinic acid peroxide, 2,5-dimethyl-2,5-di(2-ethylhexanoylperoxy)hexane, t-hexylperoxy-2-ethylhexanoate, di(4-methylbenzoyl) peroxide, t-butylperoxy-2-ethylhexanoate, di(3-methylbenzoyl) peroxide, benzoyl(3-methylbenzoyl)peroxide, dibenzoyl peroxide, 1,1-di(t-butylperoxy)-2-methylcyclohexane, 1,1-di(t-hexylperoxy) 3,3,5-trimethylcyclohexane, 1,1-di(t-hexylperoxy)cyclohexane, 1,1-di(t-butylperoxy)cyclohexane, 2,2-di(4,4-di-(t-butylperoxy)cyclohexyl)propane, t-hexylperoxyisopropyl monocarbonate, t-butylperoxymaleic acid, t-butylperoxy-3,5,5-trimethylhexanoate, t-butylperoxylaurate, t-butylperoxyisopropylmonocarbonate, t-butylperoxy-2-ethylhexylmonocarbonate, t-hexylperoxybenzoate, 2,5-dimethyl-2,5-di(benzolyperoxy) hexane, t-butylperoxyacetate, 2,2-di-(t-butylperoxy)butane, t-butylperoxybenzoate, n-butyl-4,4-di-t-butylperoxyvalerate, di(2-t-butylperoxyisopropyl)benzene, dicumyl peroxide, di-t-hexyl peroxide, 2,5-dimethyl-2,5-di(t-butylperoxy)hexane, t-butylcumyl peroxide, di-t-butyl peroxide, p-methane hydroperoxide, 2,5-dimethyl-2,5-di(t-butylperoxy)hexine-3, diisopropylbenzene hydroperoxide, 1,1,3,3-tetramethylbutyl hydroperoxide, cumene hydroperoxide, t-butyl hydroperoxide, 2,3-dimethyl-2,3-diphenylbutane, 2,4-dichlorobenzoyl peroxide, o-chlorobenzoyl peroxide, p-chlorobenzoyl peroxide, tris-(t-butylperoxy)triazine, 2,4,4-trimethylpentylperoxyneodecanoate, α-cumylperoxyneodecanoate, t-amylperoxy-2-ethylhexanoate, t-butylperoxyisobutyrate, di-t-butylperoxyhexahydroterephthalate, di-t-butylperoxytrimethyladipate, di-3-methoxybutylperoxydicarbonate, di-isopropylperoxydicarbonate, t-butylperoxyisopropylcarbonate, 1,6-bis(t-butylperoxycarbonyloxy)hexane, diethylene glycol bis(t-butylperoxycarbonate), t-hexylperoxyneodecanoate, and "Luperox 11" (trade name) commercially available from ARKEMA YOSHITOMI.

Preferred examples of the organic azo compound include azonitrile compounds such as "V-30", "V-40", "V-59", "V-60", "V-65" and "V-70", azoamide compounds such as "VA-080", "VA-085", "VA-086", "VF-096", "VAm-110" and "VAm-111", cyclic azoamidine compounds such as "VA-044" and "VA-61", azoamidine compounds such as "V-50" and "VA-057", azoester compounds such as "V-601" and "V-401" (each, trade name, commercially available from Wako Pure Chemical Industries), 2,2-azobis(4-methoxy-2,4-dimethylvaleronitrile), 2,2-azobis(2,4-dimethylvaleronitrile), 2,2-azobis(2-methylpropionitrile), 2,2-azobis(2,4-dimethylbutyronitrile), 1,1-azobis(cyclohexane-1-carbonitrile), 1-[(1-cyano-1-methylethyl)azo]formamide, 2,2-azobis{2-methyl-N-[1,1-bis(hydroxymethyl)-2-hydroxyethyl]propionamide}, 2,2-azobis[2-methyl-N-(2-hydroxybutyl)propionamide], 2,2-azobis[N-(2-propenyl)-2-methylpropionamide], 2,2-azobis(N-butyl-2-methylpropionamide), 2,2-azobis(N-cyclohexyl-2-methylpropionamide), 2,2-azobis[2-(2-imidazolin-2-yl) propane]dihydrochloride, 2,2-azobis[2-(2-imidazolin-2-yl) propane]disulfate dihydrate, 2,2-azobis{2-[1-(2-hydroxyethyl)-2-imidazolin-2-yl]propane}dihydrochloride, 2,2-azobis[2-[2-imidazolin-2-yl]propane], 2,2-azobis(1-imino-1-pyrrolidino-2-methylpropane)dihydrochloride, 2,2-azobis(2-methylpropionamidine)dihydrochloride, 2,2-azobis[N-(2-carboxyethyl)-2-methylpropionamidine] tetrahydrate, dimethyl-2,2-azobis(2-methylpropionate), 4,4-azobis(4-cyanovaleric acid) and 2,2-azobis(2,4,4-trimethylpentane).

As the polymerization initiator, organic azo compounds are preferable in consideration of the safety as a reagent itself and reproducibility of the molecular weight in the polymerization reaction. Of these, azo ester compounds such as "V-601" are most preferred because a harmful cyano group is not incorporated in the polymer.

A ten-hour half-life temperature of the polymerization initiator is preferably 100° C. or less. When the ten-hour half-life temperature is 100° C. or less, remaining of the polymerization initiator upon completion of the reaction can be avoided easily.

In the invention, the polymerization initiators may be used either singly or in combination.

The amount of the polymerization initiator(s) is preferably from 0.0001 to 2 moles, more preferably from 0.003 to 1 mole, especially preferably from 0.001 to 0.5 mole per mole of the monomer.

As the solvent to be used in the polymerization reaction, any solvent is usable insofar as it can dissolve Compound (I) therein at a required concentration and has no adverse effect on the properties of a film formed from the polymer. In the following description, the term "ester solvent", for example, means a solvent having in the molecule thereof an ester group.

Examples include water, alcohol solvents such as methanol, ethanol and propanol, ketone solvents such as alcohol acetone, methyl ethyl ketone, methyl isobutyl ketone, cyclohexanone and acetophenone; ester solvents such as methyl acetate, ethyl acetate, propyl acetate, isopropyl acetate, butyl acetate, pentyl acetate, hexyl acetate, methyl propionate, ethyl propionate, propylene glycol monomethyl ether acetate, γ-butyrolactone and methyl benzoate; ether solvents such as dibutyl ether, anisole and tetrahydrofuran; aromatic hydrocarbon solvents such as toluene, xylene, mesitylene, 1,2,4,5-tetramethylbenzene, pentamethylbenzene, isopropylbenzene, 1,4-diisopropylbenzene, t-butylbenzene, 1,4-di-t-butylbenzene, 1,3,5-triethylbenzene, 1,3,5-tri-t- butylbenzene, 4-t-butyl-orthoxylene, 1-methylnaphthalene and 1,3,5-triisopropylbenzene; amide solvents such as N-methylpyrrolidinone and dimethylacetamide; halogen solvents such as carbon tetrachloride, dichloromethane, chloroform, 1,2-dichloroethane, chlorobenzene, 1,2-dichlorobenzene and 1,2,4-trichlorobenzene; and aliphatic hydrocarbon solvents such as hexane, heptane, octane and cyclohexane. Of these, more preferred are ester solvents, of which methyl acetate, ethyl acetate, propyl acetate, isopropyl acetate, butyl acetate, pentyl acetate, hexyl acetate, methyl propionate, ethyl propionate, propylene glycol monomethyl ether acetate, γ-butyrolactone, and methyl benzoate are more preferred, with ethyl acetate and butyl acetate being especially preferred.

These solvents may be used either singly or in combination.

The organic solvent has preferably a boiling point of 75° C. or greater but not greater than 140° C. in order to heat the reaction mixture to a temperature necessary for decomposing the polymerization initiator at the time of reaction and distill off the organic solvent after completion of the reaction.

In the invention, the polymerization initiator may be added all at once, in portions or continuously. The latter two methods are preferred because they enable an increase in the molecular weight and in addition, are advantageous from the viewpoint of the film strength.

It is especially preferred from the viewpoint of film strength and reproducibility of the molecular weight at the time of the polymerization reaction to add the polymerization initiator in portions or continuously while keeping the reaction mixture composed of Compound (I) and organic solvent at the one-hour half-life temperature or greater of the polymerization initiator.

The conditions most suited for the polymerization reaction in the invention differ, depending on the kind or concentration of the polymerization initiator, monomer or solvent. The polymerization reaction is performed preferably at an inner temperature of from 0 to 200° C., more preferably from 40 to 170° C., especially preferably from 70 to 140° C. for a period of preferably from 1 to 50 hours, more preferably from 2 to 20 hours, especially preferably from 3 to 10 hours.

To suppress the inactivation of the polymerization initiator which will otherwise occur by oxygen, the reaction is performed preferably in an inert gas atmosphere (for example, nitrogen or argon). The oxygen concentration upon reaction is preferably 100 ppm or less, more preferably 50 ppm or less, especially preferably 20 ppm or less.

The composition of the invention is preferably soluble in an organic solvent. The term "soluble in an organic solvent" as used herein means that 5 mass % or greater of the composition of the invention dissolves at 25° C. in a solvent selected from cyclohexanone, methyl ethyl ketone, methyl isobutyl ketone, propylene glycol monomethyl ether acetate, propylene glycol monomethyl ether and γ-butyrolactone. Preferably 10 mass % or greater, more preferably 20 mass % or greater of the composition dissolves in the solvent.

When the composition of the invention is prepared, the reaction mixture after the polymerization reaction of Compound (I) may be used as is as the composition of the invention but it is preferred to distill and concentrate the reaction mixture to remove the reaction solvent and use the concentrate as the composition. It is also preferred to use it after re-precipitation treatment.

The reaction mixture is concentrated preferably by heating and/or pressure reduction in a rotary evaporator, distiller or reaction apparatus used for the polymerization reaction. The temperature of the reaction mixture at the time of concentration is typically from 0 to 180° C., preferably from 10 to 140° C., more preferably from 20 to 100° C., most preferably from 30 to 60° C. The pressure at the time of concentration is typically from 0.133 Pa to 100 kPa, preferably from 1.33 Pa to 13.3 kPa, more preferably from 1.33 Pa to 1.33 kPa.

When the reaction mixture is concentrated, it is concentrated until the solid content in the reaction mixture reaches preferably 10 mass % or greater, more preferably 30 mass % or greater, most preferably 50 mass % or greater.

To the composition of the invention or during the preparation of the composition, a polymerization inhibitor may be added to suppress excessive polymerization. Examples of the polymerization inhibitor include 4-methoxyphenol and catechol.

In the invention, it is preferred that the polymer of Compound (I) is dissolved in an appropriate solvent and then the resulting solution is applied to a substrate. Examples of the usable solvent include ethylene dichloride, cyclohexanone, cyclopentanone, 2-heptanone, methyl isobutyl ketone, γ-butyrolactone, methyl ethyl ketone, methanol, ethanol, dimethylimidazolidinone, ethylene glycol monomethyl ether, ethylene glycol monoethyl ether, ethylene glycol dimethyl ether, 2-methoxyethyl acetate, ethylene glycol monomethyl ether acetate, propylene glycol monomethyl ether (PGME), propylene glycol monomethyl ether acetate (PGMEA), tetraethylene glycol dimethyl ether, triethylene glycol monobutyl ether, triethylene glycol monomethyl ether, isopropanol, ethylene carbonate, ethyl acetate, butyl acetate, methyl lactate, ethyl lactate, methyl methoxypropionate, ethyl ethoxypropionate, methyl pyruvate, ethyl pyruvate, propyl pyruvate, N,N-dimethylformamide, dimethylacetamide, dimethylsulfoxide, N-methylpyrrolidone, tetrahydrofuran, diisopropylbenzene, toluene, xylene, and mesitylene. These solvents may be used either singly or as a mixture.

Of these, preferred are propylene glycol monomethyl ether acetate, propylene glycol monomethyl ether, 2-heptanone, cyclohexanone, γ-butyrolactone, ethylene glycol monomethyl ether, ethylene glycol monoethyl ether, ethylene glycol monoethyl ether acetate, propylene glycol monomethyl ether, propylene glycol monomethyl ether, ethylene carbonate, butyl acetate, methyl lactate, ethyl lactate, methyl methoxypropionate, ethyl ethoxypropionate, N-methylpyrrolidone, N,N-dimethylformamide, tetrahydrofuran, methyl isobutyl ketone, xylene, mesitylene and diisopropylbenzene.

A solution obtained by dissolving the composition of the invention in an appropriate solvent is also embraced in the scope of the composition of the invention. A total solid concentration in the solution of the invention is preferably from 1 to 30 mass % and is regulated as needed according to the purpose of use. When the total solid concentration of the composition is within a range of from 1 to 30 mass %, the thickness of a coated film falls within an appropriate range, and a coating solution has better storage stability.

The composition of the invention may contain a polymerization initiator, but the composition not containing a polymerization initiator is preferred because it has better storage stability.

When the composition of the invention must be cured at a low temperature, however, it preferably contains a polymerization initiator. In such a case, polymerization initiators similar to those cited above can be employed. Also an initiator which induces polymerization by radiation may also be utilized for this purpose.

The content of metals, as an impurity, of the composition of the invention is preferably as small as possible. The metal content of the composition can be measured with high sensitivity by ICP-MS and in this case, the content of metals other than transition metals is preferably 30 ppm or less, more preferably 3 ppm or less, especially preferably 300 ppb or less. The content of the transition metal is preferably as small as possible because it accelerates oxidation by its high catalytic capacity and the oxidation reaction in the prebaking or thermosetting step raises the dielectric constant of the film obtained by the invention. The metal content is preferably 10 ppm or less, more preferably 1 ppm or less, especially preferably 100 ppb or less.

The metal concentration of the composition can also be evaluated by subjecting a film obtained using the composition of the invention to total reflection fluorescent X-ray analysis. When W ray is employed as an X-ray source, metal elements such as K, Ca, Ti, Cr, Mn, Fe, Co, Ni, Cu, Zn, and Pd can be observed. Their concentration is preferably from $100 \times 10^{10}$ $cm^{-2}$ or less, more preferably $50 \times 10^{10}$ $cm^{-2}$ or less, especially preferably $10 \times 10^{10}$ $cm^{-2}$ or less. In addition, Br, that is, a halogen can also be observed. Its remaining amount is preferably $10000 \times 10^{10}$ $cm^{-2}$ or less, more preferably $1000 \times 10^{10}$ $cm^{-2}$ or less, especially preferably $400 \times 10^{10}$ $cm^{-2}$ or less. Moreover, Cl can also be observed as a halogen. In order to prevent it from damaging a CVD device, etching device or the like, its remaining amount is preferably $100 \times 10^{10}$ $cm^{-2}$ or less, more preferably $50 \times 10^{10}$ $cm^{-2}$ or less, especially preferably $10 \times 10^{10}$ $cm^{-2}$ or less.

To the composition of the invention, additives such as radical generator, colloidal silica, surfactant, silane coupling agent and adhesive agent may be added without impairing the properties (such as heat resistance, dielectric constant, mechanical strength, coatability, and adhesion) of an insulating film obtained using it.

Any colloidal silica may be used in the invention. For example, a dispersion obtained by dispersing high-purity silicic anhydride in a hydrophilic organic solvent or water and having typically an average particle size of from 5 to 30 nm, preferably from 10 to 20 nm and a solid concentration of from about 5 to 40 mass % can be used.

Any surfactant may be added in the invention. Examples include nonionic surfactants, anionic surfactants and cationic surfactants. Further examples include silicone surfactants, fluorosurfactants, polyalkylene oxide surfactants, and acrylic surfactants. In the invention, these surfactants may be used either singly or in combination. As the surfactant, silicone surfactants, nonionic surfactants, fluorosurfactants and acrylic surfactants are preferred, with silicone surfactants being especially preferred.

The amount of the surfactant to be used in the invention is preferably from 0.01 mass % or greater but not greater than 1 mass %, more preferably from 0.1 mass % or greater but not greater than 0.5 mass % based on the total amount of the film-forming coating solution.

The term "silicone surfactant" as used herein means a surfactant containing at least one Si atom. Any silicone surfactant may be used in the invention, but it has preferably a structure containing an alkylene oxide and dimethylsiloxane, more preferably a structure containing the following chemical formula:

In the above formula, $R^1$ represents a hydrogen atom or a $C_{1-5}$ alkyl group, x stands for an integer of from 1 to 20, and m and n each independently represents an integer of from 2 to 100. A plurality of $R^1$ s may be the same or different.

Examples of the silicone surfactant to be used in the invention include "BYK 306", "BYK 307" (each, trade name; product of BYK Chemie), "SH7PA", "SH21PA", "SH28PA", and "SH30PA" (each, trade name; product of Dow Corning Toray Silicone) and Troysol S366 (trade name; product of Troy Chemical).

As the nonionic surfactant to be used in the invention, any nonionic surfactant is usable. Examples include polyoxyethylene alkyl ethers, polyoxyethylene aryl ethers, polyoxyethylene dialkyl esters, sorbitan fatty acid esters, fatty-acid-modified polyoxyethylenes, and polyoxyethylene-polyoxypropylene block copolymers.

As the fluorosurfactant to be used in the invention, any fluorosurfactant is usable. Examples include perfluorooctyl polyethylene oxide, perfluorodecyl polyethylene oxide and perfluorododecyl polyethylene oxide.

As the acrylic surfactant to be used in the invention, any acrylic surfactant is usable. Examples include (meth)acrylic acid copolymers.

Any silane coupling agent may be used in the invention. Examples include 3-glycidyloxypropyltrimethoxysilane, 3-aminoglycidyloxypropyltriethoxysilane, 3-methacryloxypropyltrimethoxysilane, 3-glycidyloxypropylmethyldimethoxysilane, 1-methacryloxypropylmethyldimethoxysilane, 3-aminopropyltrimethoxysilane, 3-aminopropyltriethoxysilane, 2-aminopropyltrimethoxysilane, 2-aminopropyltriethoxysilane, N-(2-aminoethyl)-3-aminopropyltrimethoxysilane, N-(2-aminoethyl)-3-aminopropylmethyldimethoxysilane, 3-ureidopropyltrimethoxysilane, 3-ureidopropyltriethoxysilane, N-ethoxycarbonyl-3-aminopropyltrimethoxysilane, N-ethoxycarbonyl-3-aminopropyltriethoxysilane, N-triethoxysilylpropyltriethylenetriamine, N-trimethoxysilylpropyltriethylenetriamine, 10-trimethoxysilyl-1,4,7-triazadecane, 10-triethoxysilyl-1,4,7-triazadecane, 9-trimethoxysilyl-3,6-diazanonyl acetate, 9-triethoxysilyl-3,6-diazanonyl acetate, N-benzyl-3-aminopropyltrimethoxysilane, N-benzyl-3-aminopropyltriethoxysilane, N-phenyl-3-aminopropyltrimethoxysilane, N-phenyl-3-aminopropyltriethoxysilane, N-bis(oxyethylene)-3-aminopropyltrimethoxysilane, and N-bis(oxyethylene)-3-aminopropyltriethoxysilane. In the invention, these silane coupling agents may be used either singly or in combination.

In the invention, any adhesion promoter may be used. Examples include trimethoxysilylbenzoic acid, γ-methacryloxypropyltrimethoxysilane, vinyltriacetoxysilane, vinyltrimethoxysilane, γ-isocyanatopropyltriethoxysilane, γ-glycidoxypropyltrimethoxysilane, β-(3,4-epoxycyclohexyl)ethyltrimethoxysilane, trimethoxyvinylsilane, γ-aminopropyltriethoxysilane, aluminum monoethylacetoacetate disopropylate, vinyltris(2-methoxyethoxy)silane, N-(2-aminoethyl)-3-aminopropylmethyldimethoxysilane, N-(2-aminoethyl)-3-aminopropyltrimethoxysilane, 3-chloropropylmethyldimethoxysilane, 3-chloropropyltrimethoxysilane, 3-methacryloxypropyltrimethoxysilane, 3-mercaptopropyltrimethoxysilane, trimethylchlorosilane, dimethylvinylchlorosilane, methyldiphenylchlorosilane, chloromethyldimethylchlorosilane, trimethylmethoxysilane, dimethyldiethoxysilane, methyldimethoxysilane, dimethylvinylethoxysilane, diphenyldimethoxysilane, phenyltriethoxysilane, hexamethyldisilazane, N,N'-bis(trimethylsilyl)urea, dimethyltrimethylsilylamine, trimethylsilylimidazole, vinyltrichlorosilane, benzotriazole, benzimidazole, indazole, imidazole, 2-mercaptobenzimidazole, 2-mercaptobenzothiazole, 2-mercaptobenzoxazole, urazole, thiourasil, mercaptoimidazole, mercaptopyrimidine, 1,1-dimethylurea, 1,3-dimethylurea and thiourea compounds. Functional silane coupling agents are preferred as an adhesion promoter. The amount of the adhesion promoter is preferably 10 parts by mass or less, especially preferably from 0.05 to 5 parts by mass, based on 100 parts by mass of the total solid content.

In order to obtain a film having a reduced dielectric constant, it is also possible to form a porous film by using a pore forming factor to the extent permitted by the mechanical strength of the film.

Although no particular limitation is imposed on the pore forming factor as an additive to serve as a pore forming agent, a non-metallic compound is preferred. It must satisfy both the solubility in a solvent to be used for a film-forming coating solution and compatibility with the polymer of the invention.

As the pore forming agent, polymers are usable. Examples of the polymer usable as the pore forming agent include polyvinyl aromatic compounds (such as polystyrene, polyvinylpyridine and halogenated polyvinyl aromatic compounds), polyacrylonitrile, polyalkylene oxides (such as polyethylene oxide and polypropylene oxide), polyethylene, polylactic acid, polysiloxane, polycaprolactone, polycaprolactam, polyurethane, polymethacrylates (such as polymethyl methacrylate), polymethacrylic acid, polyacrylates (such as polymethyl acrylate), polyacrylic acid, polydienes (such as polybutadiene and polyisoprene), polyvinyl chloride, polyacetal and amine-capped alkylene oxides. In addition, also usable are polyphenylene oxide, poly(dimethylsiloxane), polytetrahydrofuran, polycyclohexylethylene, polyethyloxazoline, polyvinylpyridine and polycaprolactone.

In particular, the polystyrene is suited as the pore forming agent. As the polystyrene, anionically polymerized polystyrene, syndiotactic polystyrene, and unsubstituted or substituted polystyrene (for example, poly($\alpha$-methylstyrene)) are usable, of which unsubstituted polystyrene is preferred.

As the pore forming gent, thermoplastic polymers are also usable. Examples of the thermoplastic pore forming polymer include polyacrylates, polymethacrylates, polybutadiene, polyisoprene, polyphenylene oxide, polypropylene oxide, polyethylene oxide, poly(dimethylsiloxane), polytetrahydrofuran, polyethylene, polycyclohexylethylene, polyethyloxazoline, polycaprolactone, polylactic acid and polyvinyl pyridine.

The boiling point or decomposition point of the pore forming agent is preferably from 100 to 500° C., more preferably from 200 to 450° C., especially preferably from 250 to 400° C. The molecular weight of it is preferably from 200 to 50,000, more preferably from 300 to 10,000, especially preferably from 400 to 5,000.

The amount of it in terms of mass % is preferably from 0.5 to 75%, more preferably from 0.5 to 30%, especially preferably from 1 to 20% relative to the film forming polymer.

The polymer may contain a decomposable group as the pore forming factor. The decomposition point of it is preferably from 100 to 500° C., more preferably from 200 to 450° C., especially preferably from 250 to 400° C. The content of the decomposable group is, in terms of mole %, from 0.5 to 75%, more preferably from 0.5 to 30%, especially preferably from 1 to 20% relative to the film forming polymer.

The film forming composition of the invention is used for film formation preferably after elimination therefrom of insoluble matters, gel-like components and the like by filtration through a filter. The filter to be used for such a purpose preferably has a pore size of from 0.001 to 0.2 µm, more preferably from 0.005 to 0.05 µm, most preferably from 0.005 to 0.03 µm. The filter is made of preferably PTFE, polyethylene or nylon, more preferably polyethylene or nylon.

A film available using the film forming composition of the invention can be formed by applying the film forming composition onto a substrate such as silicon wafer, $SiO_2$ wafer, SiN wafer, glass or plastic film by a desired method such as spin coating, roller coating, dip coating, scan coating, spraying, or bar coating, and then heating to remove the solvent if necessary. As a method of applying the composition to the substrate, spin coating and scan coating are preferred, with spin coating being especially preferred. For spin coating, commercially available apparatuses such as "Clean Track Series" (trade name; product of Tokyo Electron), "D-spin Series" (trade name; product of Dainippon Screen), or "SS series" or "CS series" (each, trade name; product of Tokyo Oka Kogyo) are preferably employed. The spin coating may be performed at any rotation speed, but from the viewpoint of in-plane uniformity of the film, a rotation speed of about 1300 rpm is preferred for a 300-mm silicon substrate. When the solution of the composition is discharged, either dynamic discharge in which the solution of the composition is discharged onto a rotating substrate or static discharge in which the solution of the composition is discharged onto a static substrate may be employed. The dynamic discharge is however preferred in view of the in-plane uniformity of the film. Alternatively, from the viewpoint of reducing the consumption amount of the composition, a method of discharging only a main solvent of the composition to a substrate in advance to form a liquid film and then discharging the composition thereon can be employed. Although no particular limitation is imposed on the spin coating time, it is preferably within 180 seconds from the viewpoint of throughput. From the viewpoint of the transport of the substrate, it is preferred to subject the substrate to processing (such as edge rinse or back rinse) for preventing the film from remaining at the edge of the substrate. The heat treatment method is not particularly limited, but ordinarily employed methods such as hot plate heating, heating with a furnace, heating in an RTP (Rapid Thermal Processor) to expose the substrate to light of, for example, a xenon lamp can be employed. Of these, hot plate heating or heating with a furnace is preferred. As the hot plate, a commercially available one, for example, "Clean Track Series" (trade name; product of Tokyo Electron), "D-spin Series" (trade name; product of Dainippon Screen) and "SS series" or "CS series" (trade name; product of Tokyo Oka Kogyo) is preferred, while as the furnace, "α series" (trade name; product of Tokyo Electron) is preferred.

It is especially preferred to apply the polymer of the invention onto a substrate, followed by heating to cure it. Curing of the film means hardening of the composition on the substrate to give a solvent resistance to the film. For curing, heat treatment (curing) is especially preferred. For this purpose, the polymerization reaction, at the time of post heating, of vinyl groups remaining in the polymer may be utilized. The post heat treatment is performed preferably at a temperature of from 100 to 450° C., more preferably from 200 to 420° C., especially preferably from 350 to 400° C. for a period of preferably from 1 minute to 2 hours, more preferably from 10 minutes to 1.5 hours, especially preferably from 30 minutes to 1 hour. The post heat treatment may be performed in several times. This post heat treatment is performed especially preferably in a nitrogen atmosphere in order to prevent thermal oxidation due to oxygen.

In the invention, curing may be accomplished not by heat treatment but by exposure to high energy radiation to cause the polymerization reaction of vinyl or ethynyl groups remaining in the polymer. Examples of the high energy radiation include, but not limited to, an electron beam, ultraviolet ray and X ray.

When an electron beam is employed as high energy radiation, the energy is preferably from 0 to 50 keV, more preferably from 0 to 30 keV, especially preferably from 0 to 20 keV. Total dose of the electron beam is preferably from 0 to 5 $\mu C/cm^2$, more preferably from 0 to 2 $\mu C/cm^2$, especially preferably from 0 to 1 $\mu C/cm^2$. The substrate temperature when it is exposed to the electron beam is preferably from 0 to 450° C., more preferably from 0 to 400° C., especially preferably from 0 to 350° C. Pressure is preferably from 0 to 133 kPa, more preferably from 0 to 60 kPa, especially preferably from 0 to 20 kPa. The atmosphere around the substrate is preferably an atmosphere of an inert gas such as Ar, He or nitrogen from the viewpoint of preventing oxidation of the polymerized substance of the invention. An oxygen, hydrocarbon or ammonia gas may be added for the purpose of causing a reaction with plasma, electromagnetic wave or chemical species generated by the interaction with the electron beam. In the invention, exposure to the electron beam may be carried out in plural times. In this case, the exposure to the electron beam is not necessarily carried out under the same conditions but the conditions may be changed every time.

An ultraviolet ray may be employed as high energy radiation. The radiation wavelength range of the ultraviolet ray is preferably from 190 to 400 nm, while its output immediately above the substrate is preferably from 0.1 to 2000 mWcm$^{-1}$. The substrate temperature upon exposure to the ultraviolet ray is preferably from 250 to 450° C., more preferably from 250 to 400° C., especially preferably from 250 to 350° C. As the atmosphere around the substrate, an atmosphere of an inert gas such as Ar, He or nitrogen is preferred from the viewpoint of preventing oxidation of the polymerized substance of the invention. The pressure at this time is preferably from 0 to 133 kPa.

The composition of the invention may be also be cured by carrying out heat treatment and exposure to high energy radiation simultaneously or successively.

When an insulating film is formed, a film having a thickness, in terms of thickness after drying, of from approximately 0.05 to 1.5 µm can be formed by single application and a film having a thickness of from approximately 0.1 to 3 µm can be formed by double application.

In order to prevent decomposition of the cage structure during curing, it is preferred that a group (such as hydroxyl group or silanol group) nucleophilically attacking Si atoms during the preparation of the composition or formation of the insulating film is substantially absent.

Described specifically, a low-dielectric-constant insulating film can be formed by applying the composition of the invention onto a substrate (typically a substrate having metal interconnects), for example, by spin coating, drying off the solvent by preliminary heat treatment, and then carrying out final heat treatment (annealing) at a temperature of 300° C. or greater but not greater than 430° C.

When the film obtained using the film forming composition of the invention is used as an interlayer insulating film for semiconductor, a barrier layer for preventing metal migration may be disposed on the side surfaces of an interconnect. As well as a cap layer, an interlayer adhesion layer or the like for preventing peeling during CMP (chemical mechanical polishing), an etching stopping layer may be disposed on the upper or bottom surface of the interconnect or interlayer insulating film. Moreover, the layer of an interlayer insulating film may be composed of plural layers which are not necessarily made of the same material.

The insulating film of the invention may be used as a stack structure with another Si-containing insulating film or organic film. It is preferably used as a stack structure with a hydrocarbon-based film.

The film obtained using the film forming composition of the invention can be etched for forming copper wiring or another purpose. Either wet etching or dry etching can be employed, but dry etching is preferred. For dry etching, either ammonia plasma or fluorocarbon plasma can be used as needed. For the plasma, not only Ar but also a gas such as oxygen, nitrogen, hydrogen or helium can be used. Etching may be followed by ashing for the purpose of removing a photoresist or the like used for etching. Moreover, an ashing residue may be removed by washing.

The film obtained using the film forming composition of the invention may be subjected to CMP for planarizing a copper plated portion after copper wiring. As a CMP slurry (chemical solution), a commercially available one (for example, product of Fujimi Incorporated, Rodel Nitta, JSR or Hitachi Chemical) can be used as needed. As a CMP apparatus, a commercially available one (for example, product of Applied Material or Ebara Corporation) can be used as needed. After CMP, the film can be washed in order to remove therefrom the slurry residue.

The film available using the film forming composition of the invention can be used for various purposes. For example, it is suited as an insulating film for semiconductor devices such as LSI, system LSI, DRAM, SDRAM, RDRAM, and D-RDRAM, and for electronic parts such as multi-chip module multilayered wiring boards. More specifically, it is usable as an interlayer insulating film, etching stopper film, surface protective film, or buffer coat film for semiconductor, a passivation film or α-ray blocking film for LSI, a cover lay film or overcoat film in flexographic plate, a cover coat for flexible copper-lined plate, a solder resist film, or a liquid-crystal alignment film. It is also usable as a surface protective film, anti-reflection film or phase difference film for optical devices.

By the above-described process, an insulating film with a low dielectric constant, that is, an insulating film with a relative dielectric constant of 2.5 or less, preferably 2.3 or less is available.

EXAMPLES

The invention will hereinafter be described more specifically by Examples.

Synthesis Example 1

To 361 g of ethyl acetate was added 1 g of a mixture (Model Number: OL1170, product of Hybrid Plastics) of a cage-like silsesquioxane composed of $8H_2C=CH-Si(O_{0.5})_3$ units, a cage-like silsesquioxane composed of $10H_2C=CH-Si(O_{0.5})_3$ units, and a cage-like silsesquioxane composed of $12H_2C=CH-Si(O_{0.5})_3$ units and the resulting mixture was heated under reflux in a nitrogen gas stream (internal temperature: 78° C.). As a polymerization initiator, a solution obtained by diluting 4 µl of "Luperox 11" (trade name; product of ARKEMA YOSHITOMI, ten-hour half life temperature: 58° C.) with 4 ml of ethyl acetate was added dropwise over 5 hours. After completion of the dropwise additions the reaction mixture was heated under reflux for 2 hours. After cooling to room temperature, the mixture was concentrated under reduced pressure to a liquid weight of 2 g. Then, 20 ml of methanol was added and the mixture was stirred for 1 hour. The reaction mixture was filtered, followed by drying to yield 0.95 g of solids. The solids were dissolved in 15 ml of tetrahydrofuran. While stirring, 5.5 ml of water was added dropwise. After stirring for one hour, the reaction mixture was filtered, followed by drying to yield 0.52 g of solids. As a result of GPC analysis of the solids, a component having a molecular weight greater than that of the mixture of cage-type silsesquioxane compounds serving as a starting material had Mn of 51,000, Mw of 138,000 and Mz+1 of 370,000; a component having a molecular weight of 3,000,000 or greater was not contained; and the starting material which had remained unreacted accounted for 3 mass % or less of the solids. "Waters 2695" (trade name) and a GPC column "KF-805L" (trade name; product of Shodex) were used for GPC and 50 μl of a tetrahydrofuran solution having a sample concentration of 0.5 mass % was poured while setting a column temperature at 40° C. and using tetrahydrofuran as an elution solvent at a flow rate of 1 ml/min. A calibration curve of a monomer was constructed using integrated values obtained from an RI detector ("Waters 2414", trade name) and a monomer content in the solids was determined. The Mn, Mw and $M_{Z+1}$ were calculated based on a calibration curve constructed using standard polystyrene.

As a result of measurement of $^1$H-NMR spectrum of the solids by using deuterized chloroform as a measuring solvent, a proton peak derived from alkyl groups obtained by the polymerization of the vinyl groups and a proton peak derived from the remaining vinyl groups were observed at an integration ratio of 43:57. This suggests the polymerization of the vinyl groups.

By adding 5 ml of cyclohexanone to 0.3 g of the composition, followed by stirring at 40° C. for 3 hours, a uniform solution was obtained as Composition A.

It is apparent from the weight of the remaining monomers and weight of the additives that the polymerized product obtained by the reaction between vinyl groups of the monomers accounts for 70 mass % or greater of the solids in Composition A.

Synthesis Example 2

To 52.8 g of butyl acetate was added 1 g of Example Compound (I-d) (product of Aldrich). While heating under reflux (internal temperature: 127° C.) in a nitrogen gas stream, a solution obtained by diluting 4 mg of "V-601" (trade name; product of Wako Pure Chemical Industries, ten-hour half-life temperature: 66° C.) with 4 ml of butyl acetate was added dropwise over 2 hours as a polymerization initiator. After completion of the dropwise addition, the reaction mixture was heated under reflux for 1 hour. As a polymerization inhibitor, 20 mg of 4-methoxyphenol was added. After cooling to room temperature, the mixture was concentrated under reduced pressure to a liquid weight of 2 g. Then, 20 ml of methanol was added and the mixture was stirred for 1 hour. A solid matter was collected by filtration and then dried. The solid matter was dissolved in 10 ml of tetrahydrofuran. While stirring, 1.8 ml of water was added dropwise. After stirring for one hour, the supernatant was removed by decantation and 10 ml of methanol was added to the residue. A solid matter was collected by filtration and dried to yield 0.49 g of solids. As a result of GPC analysis of the solids, a component having a molecular weight greater than that of Example Compound (I-d) had Mw of 158,000, Mz+1 of 310,000, and Mn of 89,000; Example Compound (I) which had remained unreacted accounted for 3 mass % or less of the solids; and a component having a molecular weight of 3,000,000 or greater was not contained. As a result of measurement of $^1$H-NMR spectrum of the solids by using deuterized chloroform as a measuring solvent, a proton peak derived from alkyl groups obtained by the polymerization of the vinyl groups and a proton peak derived from the remaining vinyl groups were observed at an integration ratio of 48:52. This suggests the polymerization of the vinyl groups.

By adding 5 ml of propylene glycol methyl ether acetate to 0.3 g of the composition, followed by stirring at 40° C. for 3 hours, a uniform solution was obtained as Component B of the invention.

It is apparent from the weight of the remaining monomers and weight of the additives that the polymerized product obtained by the reaction between vinyl groups of the monomers accounts for 70 mass % or greater of the solids in the composition.

Synthesis Example 3

To 26.4 g of butyl acetate was added 1 g of Example Compound (I-d) (product of Aldrich). While heating under reflux (internal temperature: 127° C.) in a nitrogen gas stream, a solution obtained by diluting 2 mg of "V-601" (trade name; product of Wako Pure Chemical Industries, ten-hour half-life temperature: 66° C.) with 2 ml of butyl acetate was added dropwise as a polymerization initiator over 2 hours. After completion of the dropwise addition, the reaction mixture was heated under reflux for 1 hour. As a polymerization inhibitor, 20 mg of 4-methoxyphenol was added. After cooling to room temperature, the mixture was concentrated under reduced pressure to a liquid weight of 2 g. Then, 20 ml of methanol was added and the mixture was stirred for 1 hour. A solid matter was collected by filtration and then dried. The solid matter was dissolved in 15 ml of tetrahydrofuran. While stirring, 6 ml of water was added dropwise. After stirring for one hour, the supernatant was removed by decantation and 10 ml of methanol was added to the residue. A solid matter was collected by filtration and dried to yield 0.60 g of solids. As a result of GPC analysis of the solids, a component having a molecular weight greater than that of Compound (I-d) had Mn of 34,000, Mw of 118,000, and Mz+1 of 270,000; Example Compound (I-d) which had remained unreacted accounted for 3 mass % or less in the solids; and a component having a molecular weight of 3,000,000 or greater was not contained. As a result of measurement of $^1$H-NMR spectrum of the solids by using deuterized chloroform as a measuring solvent, a proton peak derived from alkyl groups obtained by the polymerization of the vinyl groups and a proton peak derived from the remaining vinyl groups were observed at an integration ratio of 42:58. This suggests the polymerization of vinyl groups.

By adding 5 ml of propylene glycol methyl ether acetate to 0.3 g of the composition, followed by stirring at 40° C. for 3 hours, a uniform solution was obtained as Component C of the invention.

It is apparent from the weight of the remaining monomers and weight of the additives that the polymerized product obtained by the reaction between vinyl groups of the monomers accounts for 70 mass % or greater of the solids in the composition.

Synthesis Example 4

To 13.2 g of butyl acetate was added 1 g of Example Compound (I-d) (product of Aldrich). While heating under reflux (internal temperature: 127° C.) in a nitrogen gas stream, a solution obtained as a polymerization initiator by diluting 1 mg of "V-401" (trade name; product of Wako Pure Chemical Industries, ten-hour half-life temperature: 88° C.) with 1 ml of butyl acetate was added dropwise over 2 hours. After completion of the dropwise addition, the reaction mixture was heated under reflux for 1 hour. As a polymerization inhibitor, 20 mg of 4-methoxyphenol was added. After cooling to room temperature, the mixture was concentrated under reduced pressure to a liquid weight of 2 g. Then, 20 ml of methanol was added and the mixture was stirred for 1 hour. A solid matter was collected by filtration and then dried. The solid matter was dissolved in 10 ml of tetrahydrofuran. While stirring, 1.8 ml of water was added dropwise. After stirring for one hour, the supernatant was removed by decantation and 10 ml of methanol was added to the residue. A solid matter was collected by filtration and dried to yield 0.41 g of solids. As a result of GPC analysis of the solids, a component having a molecular weight greater than that of Example Compound (I-d) had Mw of 128,000, m/z+1 of 380,000, and Mn of 31,000; Example Compound (I-d) which had remained unreacted accounted for 3 mass % or less in the solids; and a component having a molecular weight of 3,000,000 or greater was not contained. As a result of measurement of $^1$H-NMR spectrum of the solids by using deuterized chloroform as a measuring solvent, a proton peak derived from alkyl groups obtained by the polymerization of the vinyl groups and a proton peak derived from the remaining vinyl groups were observed at an integration ratio of 53:47. This suggests the polymerization of the vinyl groups.

By adding 5 ml of propylene glycol methyl ether acetate to 0.3 g of the composition, followed by stirring at 40° C. for 3 hours, a uniform solution was obtained as Component D of the invention.

It is apparent from the weight of the remaining monomers and weight of the additives that the polymerized product obtained by the reaction between the vinyl groups of the monomers accounts for 70 mass % or greater of the solids in the composition.

Synthesis Example 5 (Comparative Example)

To 4 g of butyl acetate was added 1 g of Example Compound (I-d) (product of Aldrich). While heating under reflux (internal temperature: 127° C.) in a nitrogen gas stream, a solution obtained as a polymerization initiator by diluting 0.5 mg of "V-601" (trade name; product of Wako Pure Chemical Industries, ten-hour half-life temperature: 88° C.) with 1 ml of butyl acetate was added dropwise over 2 hours. After completion of the dropwise addition, the reaction mixture was heated under reflux for 1 hour. After cooling to room temperature, the mixture was concentrated under reduced pressure to a liquid weight of 2 g. Then, 20 ml of methanol was added and the mixture was stirred for 1 hour. A solid matter was collected by filtration and then dried to yield 0.69 g of solids. As a result of GPC analysis of the solids, a component having a molecular weight greater than that of Example Compound (I-d) had Mw of 378,000, Mz+1 of 1091,000, and Mn of 9,000; Compound (1-d) which had remained unreacted accounted for 32 mass % of the solids; and a component having a molecular weight of 3,000,000 or greater was contained in an amount of 0.1% in terms of an integrated value obtained from an RI detector.

To 0.3 g of the composition was added 5 ml of cyclohexanone and the mixture was stirred at 40° C. for 3 hours (Composition E).

Each of Compositions A to E prepared in the above Synthesis Examples was filtered through a Teflon (trade name) filter having a pore size of 0.2 μm and the filtrate was applied to a 4-inch silicon wafer by spin coating. The substrate was dried by heating at 130° C. for 1 minute and at 200° C. for 1 minute on a hot plate and then heated at 400° C. for 30 minutes in a clean oven under a nitrogen atmosphere to form a film.

The dielectric constant of the film was measured (at 25° C.) using a mercury probe manufactured by Four Dimensions. The refractive index and film loss ratio were measured using a spectroscopic ellipsometer (VASE, trade mark, product of J. A. Woollam Co).

Based on the thought that breakage of a four-membered ring structure leads to formation of a three-membered ring structure, a change of a cyclic siloxane structure before and after curing was evaluated by Raman spectroscopy. It is judged that breakage of a cyclic siloxane bond has occurred when a proportion (H) obtained by dividing a peak height at approximately 610 cm$^{-1}$ resulting from an Si—O—Si bond of the three-membered ring structure in Raman spectrum by a peak height at approximately 495 cm$^{-1}$ resulting from an Si—O—Si bond of the four-membered ring structure is large.

Curing was conducted in a clean oven (product of KOYO THERMO SYSTEMS). For thermal curing, heat treatment was performed at 400° C. for 1 hour in a nitrogen atmosphere.

Figure 1:
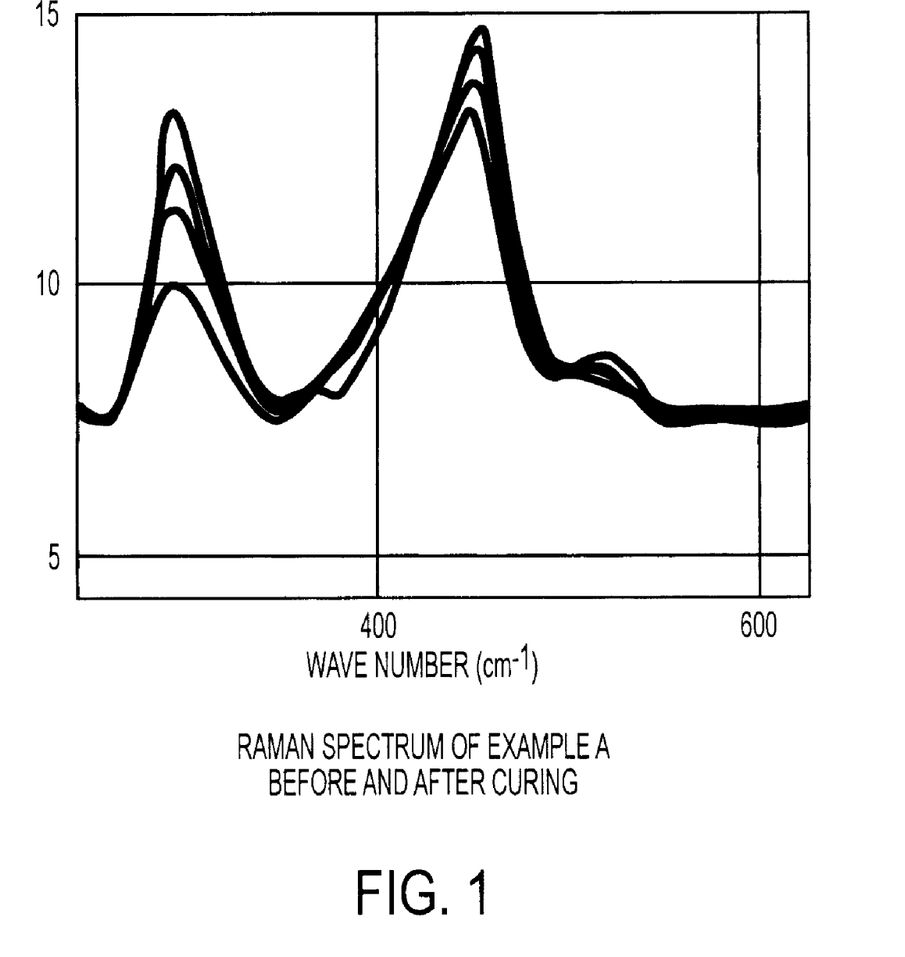
FIG. 1 is a Raman spectrum of Example A (Composition A)
Figure 2:
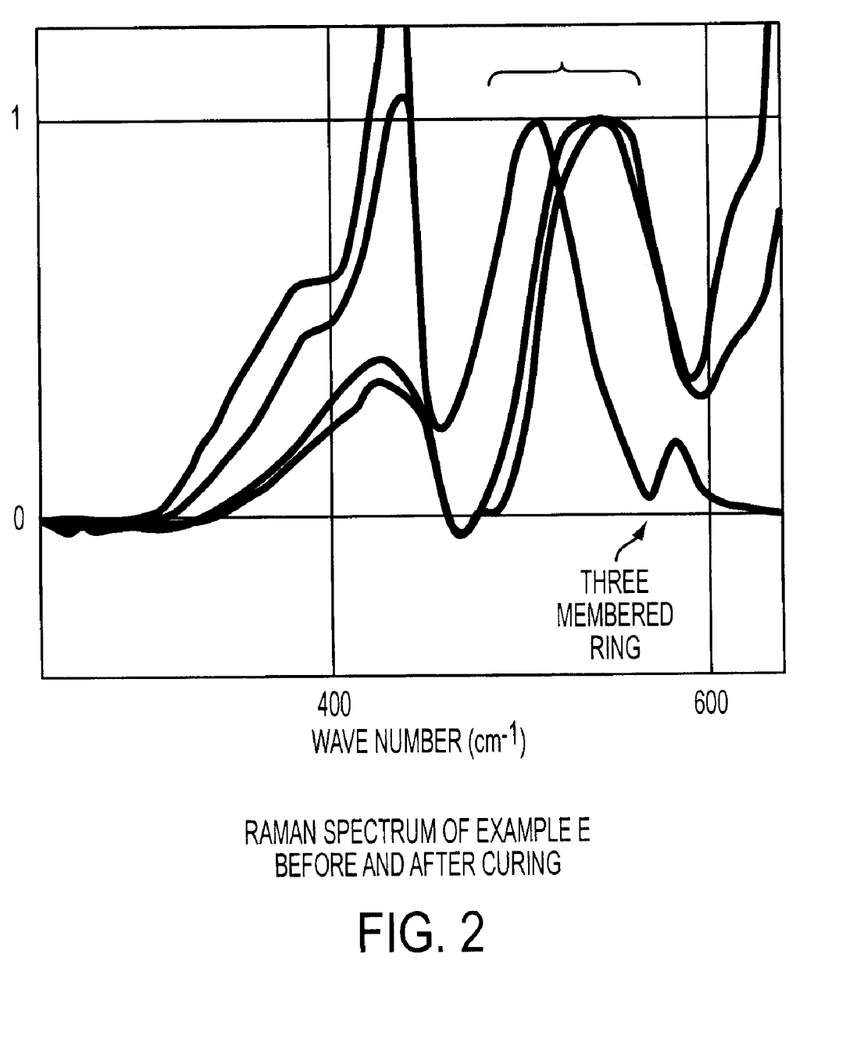
FIG. 2 is a Raman spectrum of Example E (Composition E).

Evaluation results are shown in Table 1. Raman spectra of Example A (Composition A) and Example E (Composition E) are shown in FIGS. 1 and 2, respectively.

TABLE 1

| Composition | H | Refractive index | Relative Dielectric constant |
|---|---|---|---|
| A | — | 1.34 | 2.24 |
| B | — | 1.33 | 2.17 |
| C | — | 1.34 | 2.26 |
| D | — | 1.35 | 2.29 |
| E (Comparative Example) | 0.5 | 1.48 | 2.75 |

It is apparent from the Raman spectra of Examples A and E that a three-membered ring structure has been formed in Composition E by curing and a cage structure has been broken.

The results shown in Table 1 and FIGS. 1 and 2 have revealed that the insulating films of the present invention have good surface conditions, and have a low refractive index and low dielectric constant.

The invention makes it possible to provide an insulating film which is excellent in uniformity of a film quality, has a low density and a low refractive index, and is excellent in film properties such as dielectric constant and Young's modulus and is therefore suited for use as an interlayer insulating film in semiconductor devices and the like or a low-refractive-index film in optical devices.

The entire disclosure of each and every foreign patent application from which the benefit of foreign priority has been claimed in the present application is incorporated herein by reference, as if fully set forth.

What is claimed is:

1. An insulating film for semiconductor devices obtained by curing, on a substrate, a high molecular compound obtained by polymerizing a cage-type silsesquioxane compound having two or more unsaturated groups as substituents and having a cyclic siloxane structure,
   wherein:
   the structure of the cage-type silsesquioxane compound is not broken by curing;
   the cage-type silsesquioxane compound has m number of RSi(O$_{0.5}$)$_3$ units, in which m stands for an integer of from 8 to 16, and Rs each independently represent a non-hydrolyzable group, with the proviso that at least two of Rs are each a vinyl- or ethynyl-containing group;
   each of the units is linked to another unit via an oxygen atom possessed in common and constitutes the cage structure; and
   at least two of Rs are vinyl groups.

2. The insulating film according to claim 1, wherein a peak at approximately 610 cm$^{-1}$ is not observed in a Raman spectrum of the film after curing.

3. The insulating film according to claim 1, wherein m stands for an integer of 8, 10 or 12.

4. The insulating film according to claim 1, wherein Rs are all vinyl groups.

* * * * *